United States Patent [19]

Milford

[11] 3,833,853

[45] Sept. 3, 1974

[54] METHOD AND APPARATUS FOR TESTING PRINTED WIRING BOARDS HAVING INTEGRATED CIRCUITS

[75] Inventor: Richard E. Milford, Oklahoma City, Okla.

[73] Assignee: Honeywell Information Systems Inc., Waltham, Mass.

[22] Filed: Apr. 13, 1973

[21] Appl. No.: 351,078

[52] U.S. Cl. .................................. 324/73 R, 324/51
[51] Int. Cl. .............................................. G01r 31/00
[58] Field of Search .......... 235/153 AC; 324/73 AT, 324/73 PC, 73 R, 51, 72.5

[56] References Cited

UNITED STATES PATENTS

| | | | |
|---|---|---|---|
| 3,614,608 | 10/1971 | Giedd | 324/73 R |
| 3,657,527 | 4/1972 | Kassabgi et al. | 324/73 PC X |
| 3,673,397 | 6/1972 | Schaefer | 324/73 PC X |
| 3,723,868 | 3/1973 | Foster | 324/73 AT |

OTHER PUBLICATIONS

Probe for Testing Logic, EMI Electronics Radar and Equipment Division Hayes, Middlesex, 1971.

*Primary Examiner*—Alfred E. Smith
*Assistant Examiner*—Rolf Hille
*Attorney, Agent, or Firm*—Lloyd B. Guernsey

[57] ABSTRACT

A plurality of voltage comparators are each connected to a corresponding pin of an integrated circuit on a wiring board. Each of the comparators is also connected to a sequencer which sequentially provides reference voltages to the comparators to check for shorts to ground, shorts to high voltage and incorrect signal levels at each of the pins of the integrated circuit. This apparatus may be used to test wiring boards having a wide variety of types of integrated circuits mounted thereon.

11 Claims, 6 Drawing Figures

METHOD AND APPARATUS FOR TESTING PRINTED WIRING BOARDS HAVING INTEGRATED CIRCUITS

BACKGROUND OF THE INVENTION

This invention relates to printed wiring board testers and more particularly to methods and apparatus for testing printed wiring boards having a wide variety of types of integrated circuits mounted thereon.

Modern high speed data processing systems use large numbers of logic circuits which include amplifiers, multivibrators, logic gate and timing circuits. These logic circuits are mounted on circuit boards and the circuit boards are mounted in cabinets each of which may hold a large number of these circuit boards. Prior art logic circuits were built using a plurality of transistors, resistors and capacitors mounted on circuit boards which often contain one type of circuit which was repeated several times. These circuit boards were interconnected by a plurality of wires which are mounted on the backpanels of the cabinets. Such boards could easily be tested by providing signals to the input terminals of the board and observing the signal waveforms at the output terminals of these boards. Recent advances in circuit technology have made it possible to replace the transistors, resistors and many interconnecting leads with integrated circuits so that a vast amount of logic is mounted on a single printed wiring board. These wiring boards may have a plurality of integrated circuits connected thereon with each of the integrated circuits being the equivalent of a circuit board in the prior art systems. The printed wiring boards now have etched runs which are equivalent to the interconnecting wires mounted on backpanels in the prior art data processing systems. The integrated circuits are built in the form of chips with each chip having a plurality of pins or leads which are connected to the printed wiring board. Each of the printed wiring boards becomes a complex logic network where each printed wiring board may be functionally different than any of the other printed wiring boards in the system. This has created an extremely difficult problem in testing the printed wiring boards by using the conventional approach of placing signals on the input terminals of the boards and observing the waveforms at the output terminals of the boards. Because of the many etched runs and soldered connections on each of the printed wiring boards, it is not possible to put a single signal on the input terminals of the wiring boards and receive a signal at the output which will give a meaningful indication of the condition of the printed wiring board. The prior art apparatus for testing the printed wiring board now requires a complex test specification with a laboriously created set of stepped input signals and output parameters. Only computer controlled, elaborately built test equipment is capable of testing each individual printed wiring board through the numerous steps required in such a thorough test. After all of this cost and effort it is still not assured that the printed wiring board is workable when the individual test has been completed. In many cases, the task of preparing a thorough printed wiring board test and fault isolation procedure is more difficult than the complete logic design, debug and documentation of the original printed wiring board.

The present invention alleviates the disadvantages of the prior art by providing a greatly simplified method and apparatus for testing printed wiring boards using a few standard tests to detect most of the troubles on a wide variety of types of wiring boards. In TTL logic circuits using a +5 volt power supply most of the faults in the assembled wiring board result in the development of a logic signal within the range of +0.45 volts to +2.5 volts rather than the normal logic low levels of +0.04 to +0.45 volts or the normal high logic levels of +2.5 volts to +4.5 volts. The faults which usually cause these incorrect logic levels are: (1) open circuit inputs where an etched run on the wiring board is broken; (2) a defective integrated circuit chip; (3) solder bridge between etched runs which connects two sources together; (4) incorrect integrated circuit types; and (5) integrated circuit chip oriented wrong on the printed wiring board.

It is, therefore, an object of this invention to provide a new and improved apparatus for testing assembled printed wiring boards having integrated circuits mounted thereon.

Another object of this invention is to provide apparatus for testing assembled printed wiring boards having a plurality of integrated circuits.

A further object of this invention is to provide apparatus for testing printed wiring boards and a plurality of different types of integrated circuits mounted thereon.

Another object of this invention is to provide apparatus for testing assembled printed wiring boards under both static operation and dynamic operation.

A still further object of this invention is to provide apparatus for sequentially testing assembled wiring boards and integrated circuits for shorts to ground, shorts to the power supply and incorrect signal levels.

Still another object of this invention is to provide an improved method for testing assembled printed wiring boards.

A further object of this invention is to provide an improved method for testing assembled printed wiring boards using a sequence of different tests to each of the integrated circuits mounted on the wiring board.

Another object of this invention is to provide a method for testing a wide variety of types of assembled printed circuit boards.

Still another object of this invention is to provide a method for testing assembled printed wiring boards where the logic interconnection may vary widely from one board to another.

A still further object of this invention is to provide a method for rapidly locating faults in integrated circuits on a wide variety of types of printed circuit boards having a plurality of integrated circuit ships mounted theroen.

Another object of this invention is to provide a method for testing both static and dynamic operation of the printed circuit board and the integrated circuits mounted thereon.

SUMMARY OF THE INVENTION

The foregoing objects are achieved in the instant invention by providing a method and apparatus for sequentially checking integrated circuits on printed wiring boards for shorts to ground, shorts to the power supply voltage and incorrect signal levels at each of the pins on the integrated circuit chips mounted on the printed wiring board. Logic signal levels may also be compared to signals from standard integrated circuits.

Other objects and advantages of this invention will become apparent from the following description when taken in connection with the accompanying drawings.

BRIEF DESCRIPTION OF THE DRAWINGS

FIG. 1 illustrates the signals which are normally used in the TTL logic circuits which use a 5 volt power supply. A normal signal level for binary one may be between +2.5 volts and +4.5 volts while a signal for a binary zero may be between +0.04 volts and +0.45 volts. A voltage greater than +4.5 volts may be caused by a short between the 5 volt power supply and the lead of the logic circuit. A level less than +0.04 volts may be caused by a ground connection to the lead of the logic circuit. In the high speed TTL logic circuits the signal should change between the binary one level and the binary zero level in less than 0.5 microseconds. If the signal takes more than 0.5 microseconds to go between the binary one level and the binary zero level a fault may be present in the assembled wiring board. Thus, the present invention has apparatus for testing and providing a warning signal when the time required for the signal to go between the binary one level and the binary zero level or between the binary zero and the binary one level is greater than 0.5 microseconds during normal dynamic operation.

Figure 2:
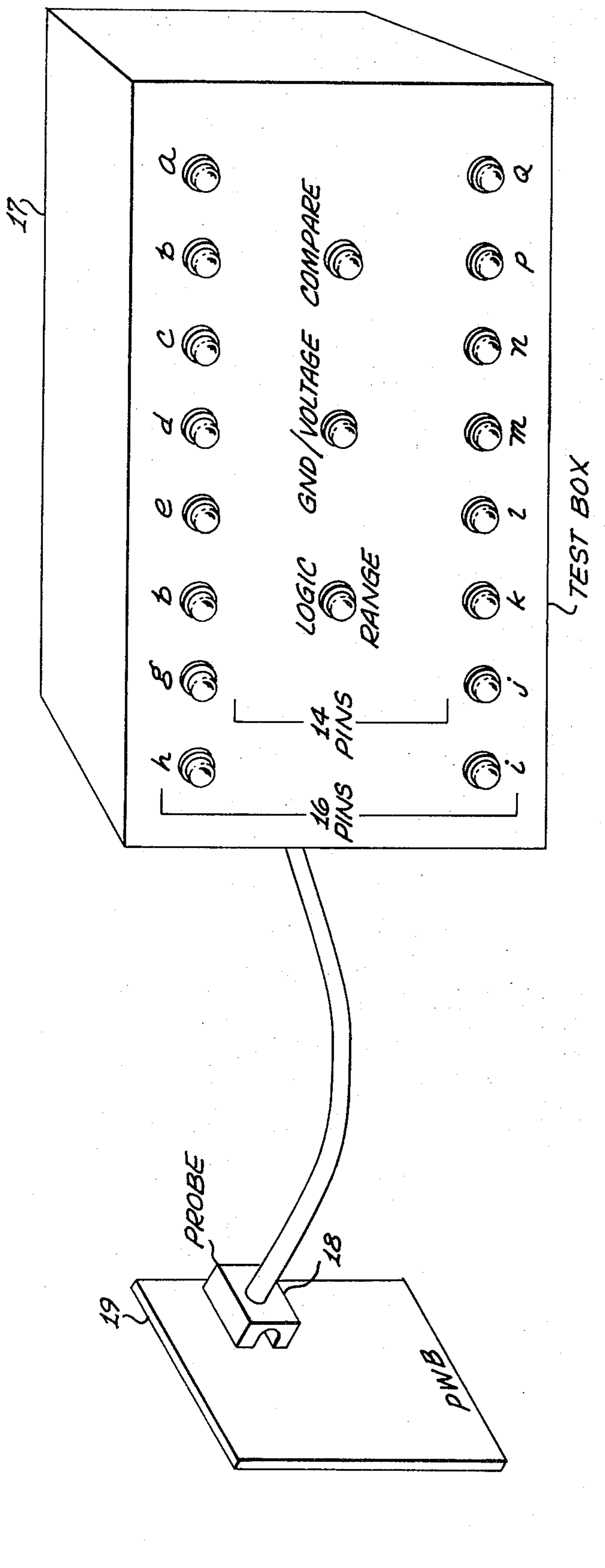
FIG. 2 illustrates the method of connecting the test apparatus to the printed wiring board.

The apparatus for detecting faults on printed wiring boards is mounted in the test box 17 shown in FIG. 2 and includes a probe 18 which is connected to the integrated circuit on a printed wiring board 19. The test box 17 has a plurality of light emitting diodes or LED's which are positioned in the windows a–q to indicate which of the pins of the integrated circuit is connected to the defective portion of the wiring board or integrated circuit chips. When a 16 pin integrated circuit chip is used the 16 LED's in the test box 17 are connected to circuits which test the respective 16 pins of the integrated circuit chip. When a 14 pin integrated circuit chip is connected to the probe the number *h* and number i LED's of the 16 pin circuit are not used. In addition to the LED's which check for faults in the integrated circuit on the printed wiring board three additional LED's on the front of the test box indicate the type of test being performed. These include a logic range LED, a ground/voltage LED and a comparator LED. When the logic range test is being performed the logic range LED on the front of the test box 17 is lighted. In a similar manner when the ground/voltage test is being performed the corresponding LED on the front of the test box is lighted. When neither the range LED nor the ground/voltage LED is on, the voltages from the integrated circuit are compared with the voltage from a standard integrated circuit chip. If any of these voltages do not compare the compare LED is lighted.

Figure 3A:
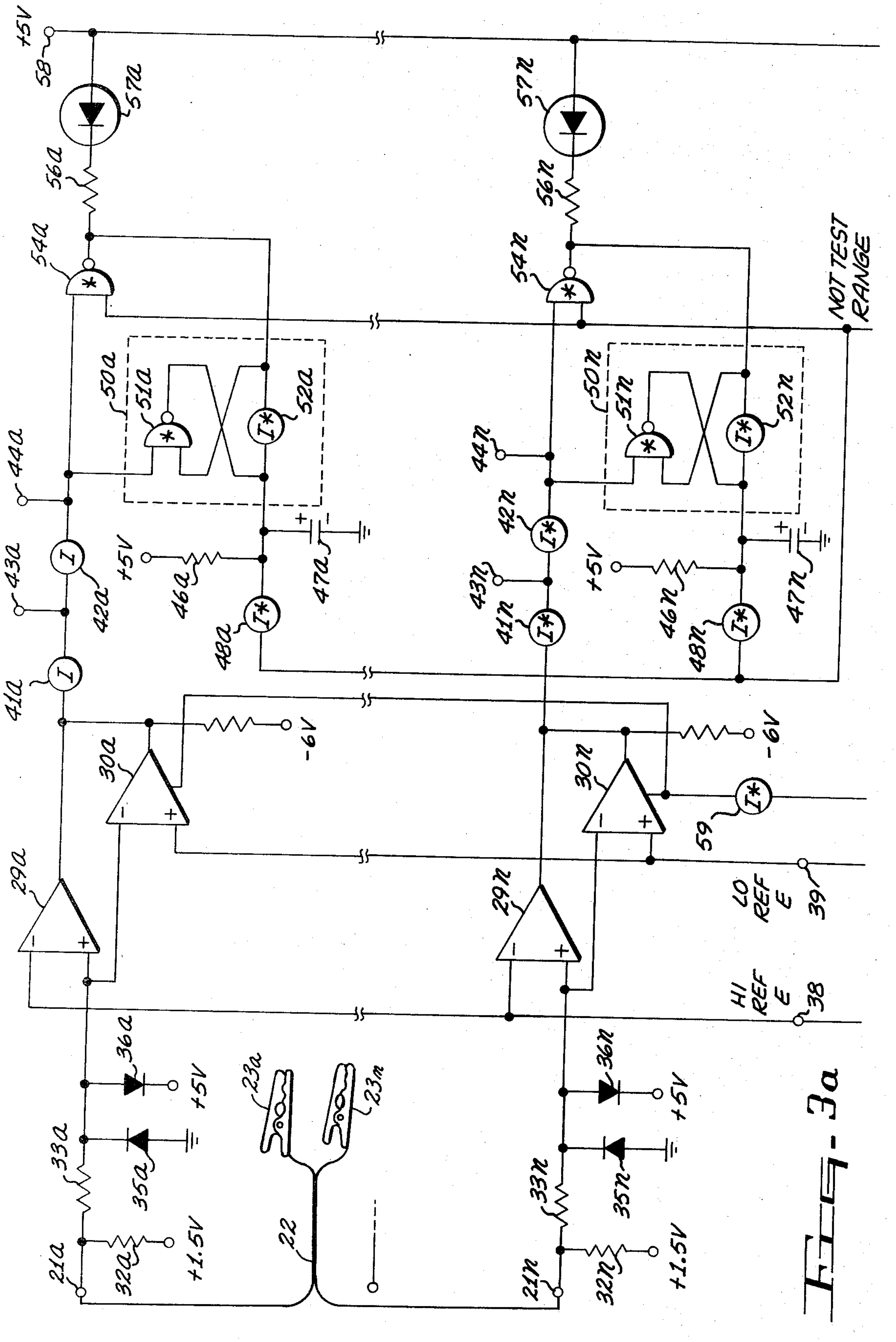
FIGS. 3*a*, 3*b* and 4 illustrate test circuits used in the present invention.
Figure 3B:
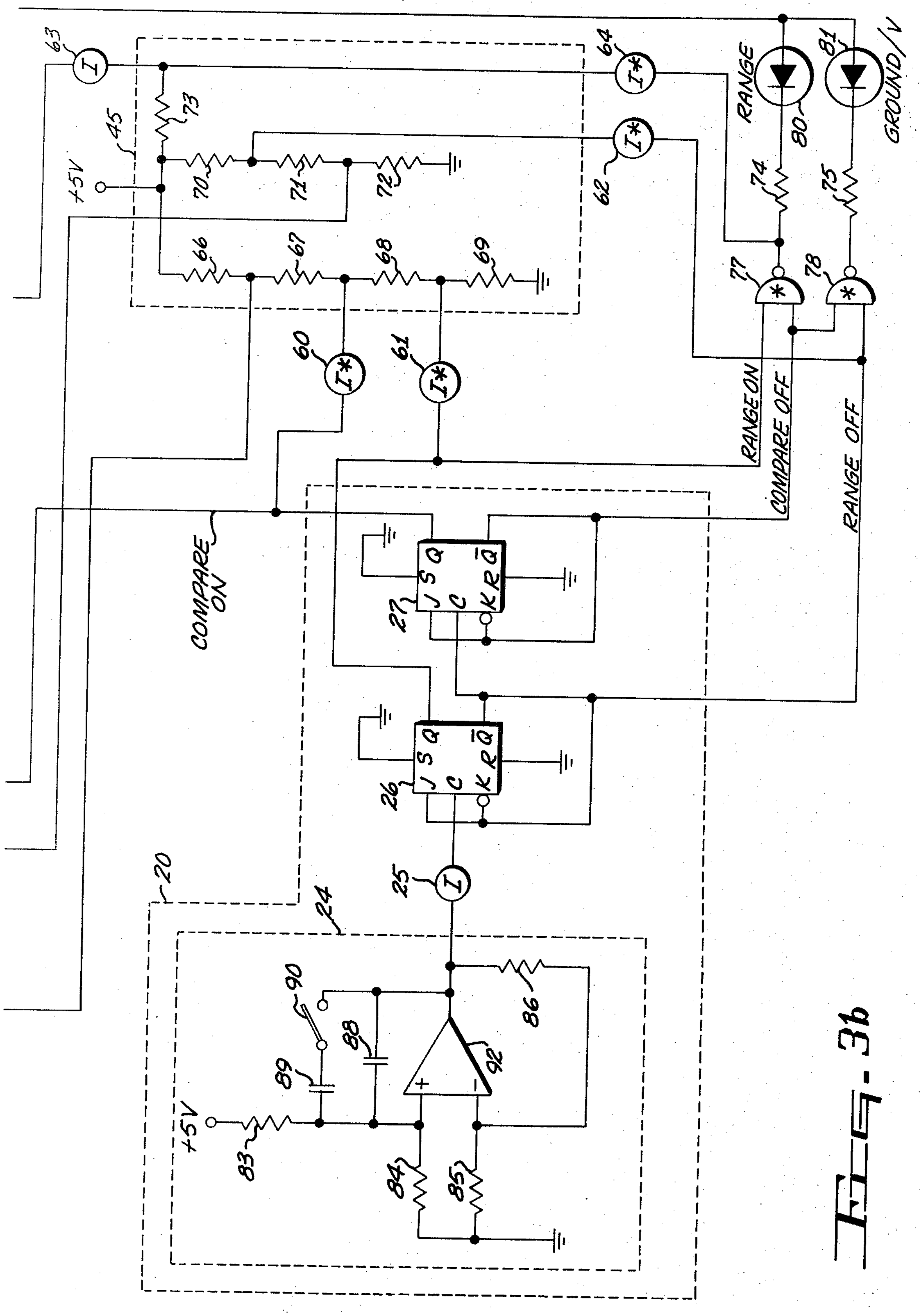
Figure 4:
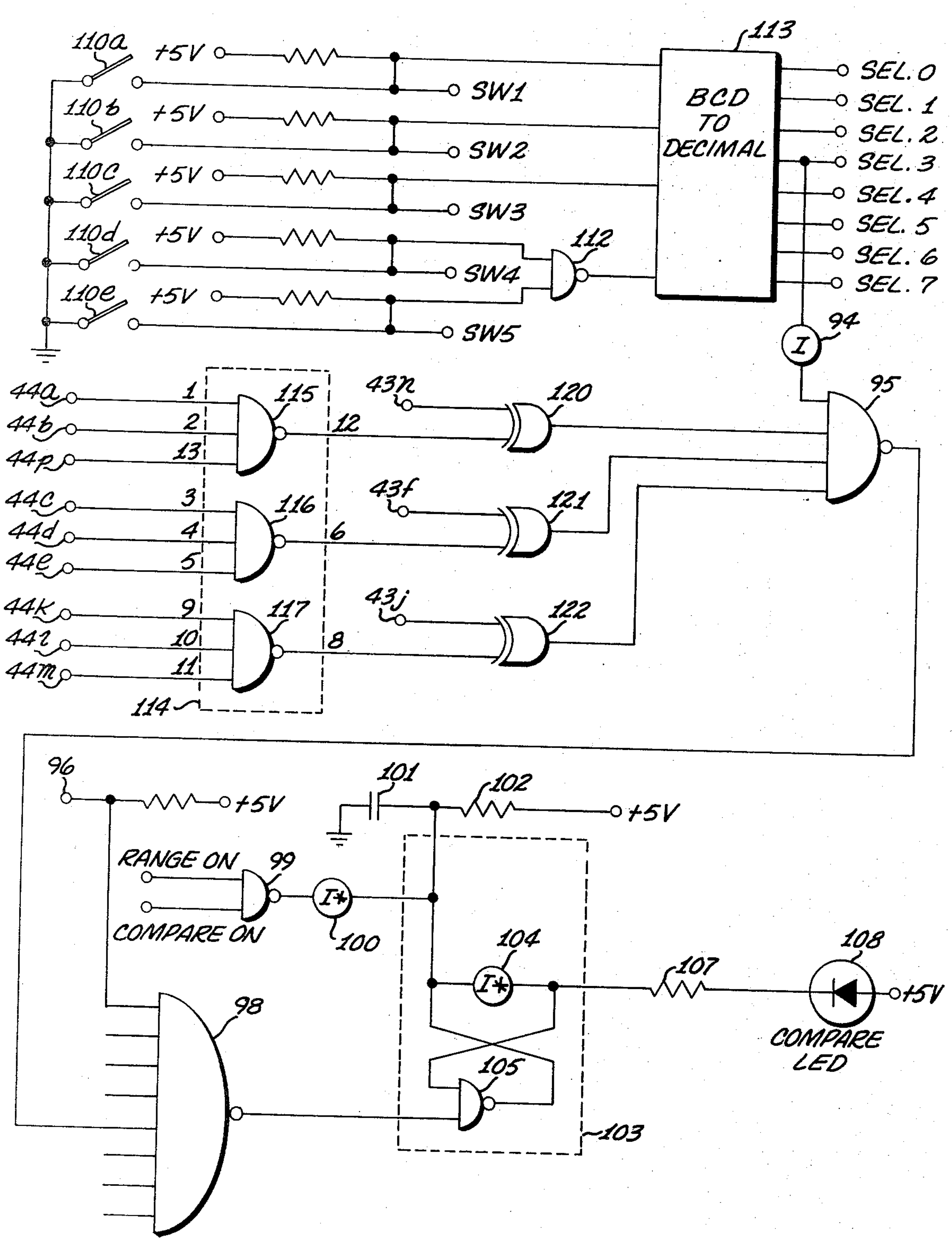

A portion of the circuit contained in the test box 17 of FIG. 2 is shown in FIGS. 3*a*, 3*b* and 4. FIGS. 3*a* and 3*b* are drawn to be placed side by side with FIG. 3*a* above 3*b*. FIGS. 3*a* and 3*b* include a sequencer 20 which provides signals to sequentially test the integrated circuit chips and a printed wiring board for shorts to ground, shorts to the supply voltage source, improper range of logic signals and compares voltages on the integrated circuit being tested with voltages from a standard integrated circuit. The test probe, which is connected to the integrated circuit chip under test, is connected to the terminals 21*a*–21*n* of the circuit of FIGS. 3*a* and 3*b*. A cable 22 contains a plurality of wires each of which is connected between a corresponding one of the terminals 21*a*–21*n* and one of the clips 23*a* –24*n*. Clips 23*a*–23*n* are each connected to one of the pins of the integrated circuit chip bearing tested.

The sequencer 20 of FIGS. 3*a* and 3*b* includes an oscillator 24, an inverter 25 and a pair of flip-flops 26 and 27. On each cycle of oscillation oscillator 24 and inverter 25 provide a positive pulse which causes the state of flip-flop 26 to change. The Q output of flip-flop 26 provides pulses which cause the state of flip-flop 27 to change once for every two changes in the state of flip-flop 26. When flip-flop 26 is in a set state a positive voltage from the Q output lead provides a positive "range on" signal which is applied to inverter 61 and NAND-gate 77. An inverter provides a logical operation of inversion for an input signal applied thereto. The inverter provides a high positive output signal representing a binary one when the input signal applied thereto has a low value, representing a binary zero. Conversely, the inverter provides an output signal representing a binary zero when the input signal represents a binary one. Such an inverter is shown in FIG. 3 and represented by the reference numerals 59–64. The inverters marked with * are open collector inverters which provide a low output voltage in response to a high input voltage; however, a low value of input voltage causes the open collector inverter to be an open circuit.

Signals from the probe connected to input terminals 21*a*–21*n* are coupled to the differential voltage comparators 29 and 30. The voltage comparators 29 and 30 are connected to form a dual voltage comparator in which the voltage from the output leads is high representing a binary one when either of the positive input leads of the two comparators is more positive than the voltage on the negative input lead. For example, when a +2.5 volts is applied to the negative input lead of comparator 29*a* a voltage of +3 volts to the positive input lead of the comparator causes a positive voltage representing a binary one to be applied to the inverter 41*a*. Also if the voltage applied to the positive lead of the comparator 30*a* is greater than the voltage applied to the negative lead of the comparator 30*a* a positive voltage representing a binary one will be applied to the inverter 41*a*. In order to have a low value of voltage representing a binary zero at the output leads of comparators 29*a* and 30*a* the voltage on each of the positive input leads must be less than the voltage on each of the negative input leads. For example, when a +2.5 volts from terminal 38 is applied to the negative input lead of comparator 29*a*, a voltage of +0.45 volts from terminal 39 is applied to the positive input lead of comparator 30*a* and a signal of 1.5 volts is applied to the input terminal 21*a*, both of the comparators 29*a* and 30*a* provide a low value of voltage to the inverter 41*a*. The comparator 30*a* may be disabled by a low value of voltage on the strobe input lead which is connected to the open collector inverter 59. The strobe input lead of comparator 29 is not connected to the circuit of FIG. 3. A dual voltage comparator which can be used for comparators 29 and 30 is the $\mu$A711 which is available from several manufacturers and whose operation is further described in the book "Fairchild Linear Integrated Circuits Data Catalog" November 1971, by Fairchild Semiconductor Corporation, Mountain View, California.

The power supply 45 provides reference voltages to the comparators 29 and 30. The four input leads of the supply 45 are coupled to the sequencer 20. The value of signals on the input leads of supply 45 determine the value of the voltages on the three output leads of the power supply. The output leads of power supply are connected to terminals 38 and 39 and to inverter 63.

The NAND-gate disclosed in FIGS. 3*a* and 3*b* provides the logical NAND function for input logic signals applied to its input leads. In the system disclosed, a binary 1 is represented by a positive signal, the NAND-gate provides an output signal of approximately zero volts representing a binary 0, when and only when, all of the input signals applied to its input leads are positive and represent binary 1's. conversely, the NAND-gate provides a positive output signal representing a binary 1 when one or more of the input signals applied thereto represent binary 0's. The NAND-gates marked with * are open collector gates which provide a low output voltage when both input signals are high; however, when either or both input signals are low the open collector gate is an open circuit.

The operation of the apparatus for checking the integrated circuit chips and the printed wiring board for shorts to ground and shorts to the +5 volt source will now be described in connection with the circuit of FIG. 3. To check for shorts, the "compare off" voltage from the $\overline{Q}$ output lead of flip-flop 27 is positive and the "range off" voltage from the $\overline{Q}$ output lead of flip-flop 26 is positive thereby causing NAND-gate 78 to provide a low value of voltage to the resistor 75. The low value of voltage at the output lead of NAND-gate 78 and the +5 volts from terminal 58 cause the light-emitting diode 81 to be lighted. The "compare on" voltage from the Q output lead of flip-flop 27 is low and the "range on" voltage from the Q output lead of flip-flop 26 is low causing inverters 60 and 61 to provide a high value of voltage so that the reference voltage at the junction point between resistors 66 and 67 is approximately +4.5 volts. This +4.5 volts is applied to terminal 38 and to the negative input leads of the voltage comparators 29*a*–29*n*. At this same time the positive "range off" voltage from the Q output lead of flip-flop 26 causes the inverter 62 to provide a low value of voltage at the junction point between resistors 70 and 71 so that a voltage of approximately +0.04 volts from the low reference voltage source is applied to terminal 39 and to the positive input leads of the voltage comparators 30*a*–30*n*. If a voltage greater than +4.5 volts is applied to one of the input terminals 21*a* –21*n* this voltage causes a corresponding one of the voltage comparators 29*a*–29*n* to provide a high output voltage representing a binary one. This high voltage applied to inverters 41 and 42 causes a high voltage to be applied to the upper input lead of a corresponding one of the NAND-gates 54*a*–54*n*.

At this same time the low value of voltage at the "range on" output lead causes a positive voltage from the output of inverter 63 to be coupled to the lower lead of each of the NAND-gates 54*a*–54*n*. A positive voltage on the upper lead of any of NAND-gates 54*a*–54*n* causes the gate to develop a low value of voltage on the output lead so that the corresponding LED 57*a*–57*n* is lighted, thereby indicating a possible short circuit from the corresponding pin of the integrated circuit chip or in its associated etched run on the printed wiring board to the +5 volt supply.

If one of the input terminals 21a-21n is shorted to ground a low value of voltage is applied to the negative input lead of the corresponding voltage comparator 30*a*–30*n*, thereby causing the voltage comparator to provide a high value of output voltage which causes the corresponding LED 57*a*–57*n* to be lighted at the same time that the ground/voltage light-emitting diode 81 is lighted.

If the voltage applied to the input terminals 21*a*–21*n* is less than +4.5 volts and more than +0.04 volts neither of the voltage comparators 29 or 30 will provide a high output voltage so that the voltage applied to the NAND-gate 54 is low thereby causing a high value of voltage at the output lead of the corresponding NAND-gate 54. The high value of voltage at the output of NAND-gate 54 causes the LED 57 to be off.

Figure 1A:
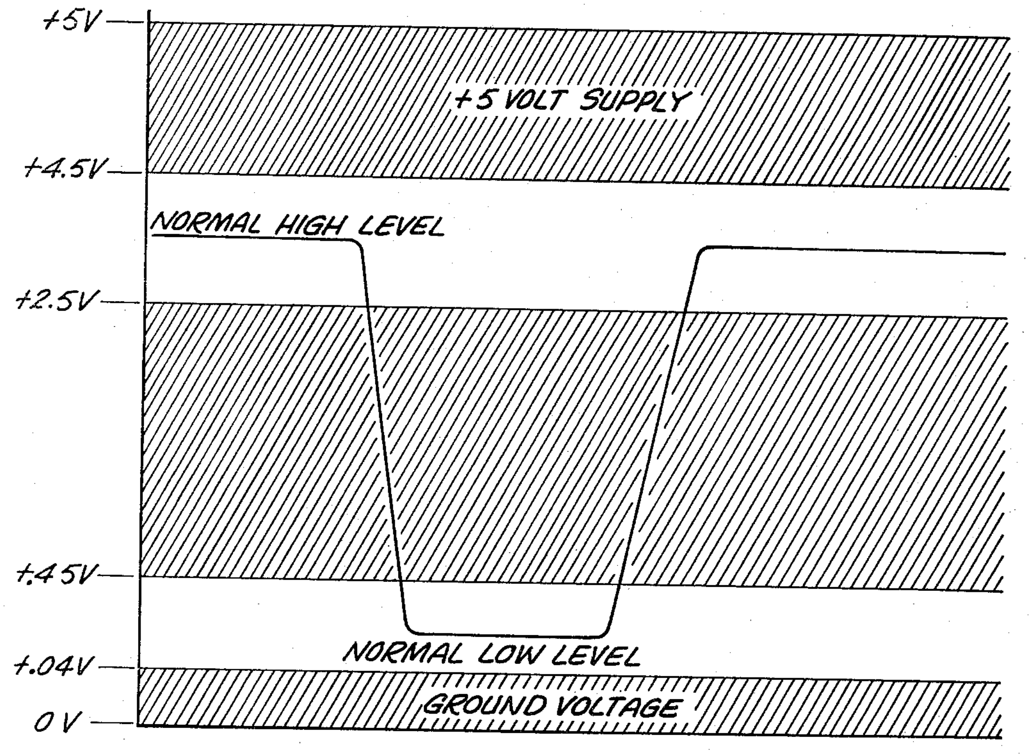
FIGS. 1*a* and 1*b* illustrate typical logic signal levels from printed wiring boards.
Figure 1B:
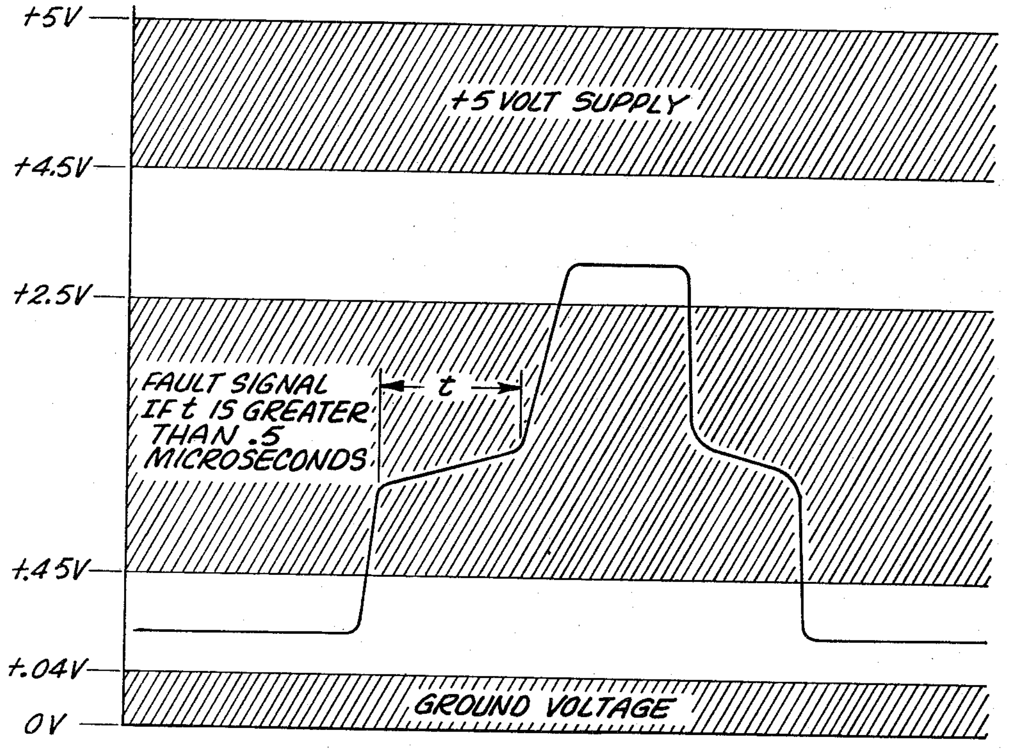

FIG. 1*a* illustrates a normal typical signal used in TTL circuits. The signal changes between the normal high level and the normal low level in less than 0.5 microseconds. If the signal should take more than 0.5 microseconds to change between these levels error signals may be introduced into the data processing system. To test an assembled printed wiring board and its integrated circuits a signal which changes from the high level to the low level in much less than 0.5 microseconds is used. A defective wiring board or defective integrated circuit may provide an output signal of the type shown in FIG. 1*b*. A "good" board will provide a signal of the type shown in FIG. 1*a*. The range test checks for this type of signal distortion by checking to see if a fault signal between +0.45 volts and +2.5 volts is coupled to input terminal 21 for more than 0.5 microseconds. During the range test the "range on" signal from the Q output lead of flip-flop 26 is high, the "compare off" signal from the $\overline{Q}$ output lead of flip-flop 27 is low. The positive "range on" signal causes the inverter 61 to provide a low value of voltage at the junction point of resistor 68 and 69 so that the high reference from the junction point between resistor 66 and resistor 67 has a value of approximately +2.5 volts which is applied to the negative input leads of the voltage comparators 29*a*–29*n*. At this same time the "range off" voltage from the $\overline{Q}$ output lead of flip-flop 26 is low causing the inverter 62 to provide a relatively high value of voltage to the junction point between resistors 70 and 71. This causes a value of voltage of approximately +0.45 volts from the low reference voltage lead to be coupled to terminal 39 and to the positive input leads of the voltage comparators 30*a*–30*n*. When a signal which is less positive than +2.5 volts and more positive than +0.45 volts is applied to one of the input terminals 21*a*–21*n*, the corresponding voltage comparators 29 and 30 each provide a low value of output voltage to inverter 41 which in turn couples a low value of voltage to the upper input lead of NAND-gate 51. This low value of voltage causes open collector gate 51 to become an open circuit. The voltage on capacitor 47 is no longer held at the low value by gate 51 so current from the +5 volt potential flowing through resistor 46 starts charging capacitor 47 toward a +5 volts. If the signal at terminal 21 stays between +0.45 volts and +2.5 volts for more than 0.5 microseconds capacitor 47 charges to a threshold value which causes open collector inverter 52 to provide a low value of voltage to resistor 56 so that LED 57 is lighted. The low value of output voltage from inverter 52 also is coupled to the lower input lead of NAND-gate 51 so that gate 51 continues to be an open circuit and capacitor 47 continues to provide a positive voltage to the input lead of the inverter 52 thereby causing the circuit 50 to latch in a set condition.

When the range test has been completed the voltage at the output lead of inverter 63 goes high causing inverter 48 to provide a low value of voltage to open collector inverter 52 thereby resetting latch 50. When the voltage at one of the input terminals 21 is greater than a positive 2.5 volts or less than a positive 0.45 volts the output voltage from one of the comparators 29 and 30 is positive thereby providing a positive input to the upper lead of the NAND-gate 51 and prevents the latch 50 from being set during the range test. When latch 50 is not set the voltage at the output lead of inverter 52 is high so that the LED 57 is not lighted.

Operation of the apparatus for comparing the voltages from an unknown integrated circuit with a standard integrated circuit will now be described in connection with the diagram shown in FIGS. 3 and 4. At this time the "compare on" signal from the Q output lead of flip-flop 27 is positive and is inverted by inverter 59 to provide a low value of voltage to voltage comparators 30*a*–30*n*, thereby disabling these voltage comparators. The positive "compare on" signal is inverted to a low value of voltage by inverter 60 and applied to the junction point between resistor 67 and 68, thereby causing the high reference voltage lead to provide approximately 1.5 volts to the negative input leads of each of the voltage comparators 29*a*–29*n*. As seen in FIGS. 1*a*, 3*a* and 3*b* with a +1.5 volt on the negative input lead of the voltage comparators the normal high level signal of FIG. 1*a* causes the voltage comparator 29 to provide the high value of voltage representing a binary one on the output lead of the comparator 29, while the normal low level signal on the input terminal 21 causes the corresponding voltage comparator 29 to provide a low value of voltage representing a binary zero on the output lead. The output voltages from the comparator 29 are inverted by inverters 41*a* and 42*a* to provide an inverted output voltage on the output terminal 43 and the corresponding output voltage on the output terminal 44.

FIG. 4 shows a portion of the standard integrated circuit boards and the associated logic which are used to provide signals which may be compared with the integrated circuit under test. The select ref. IC circuit of FIG. 4 may be used to select any one of 32 standard integrated circuits which may be compared with the circuit under test. It should be noted that only one of the standard integrated circuits is shown in FIG. 4. The standard integrated circuit 114 represents a standard 7410 integrated circuit chip which is commercially available from several sources. This 7410 integrated circuit includes NAND-gates 115–117, and in the circuit illustrated in FIG. 4 this chip is No. 3 is the test box. To select this integrated circuit chip as the standard switches 110*a* and 110*b* are closed, thereby causing the BCD to Decimal Converter 113 to provide a low value of signal on the SEL-3 output terminal. The signal from the SEL-3 causes inverter 94 to provide a positive enabling signal to the NAND-gate 95 so that when all of the signals from comparators 120, 121 and 122 are positive the NAND-gate provides a low value of output signal to the NAND-gate 98.

The signals from the output terminals 44*a*, 44*b* and 44*p* of FIGS. 3*a* and 3*b* are applied to the input leads of NAND-gate 115 of FIG. 4. The signals on terminals 44*a*, 44*b* and 44*p* have the same logic levels as the signals at the input leads of the integrated circuits being tested. The signal from the output lead of NAND-gate 115 is applied to the lower input lead of exclusive OR-gate 120 and is compared with the signal from the terminal 43*n* of FIGS. 3*a* and 3*b*. The symbol identified by the numeral 120 in FIG. 4 represents a two input exclusive OR-gate. This gate delivers a binary one output when either one and only one of its input signals applied thereto represent a binary one. When both input signals represent a binary zero this gate delivers a binary zero at the output lead. When both input signals represent a binary one this gate also delivers a binary zero at its output lead. Since the signal from the output lead of gate 115 corresponds to the signal at terminal 44*n* it must be inverted from the signal level on terminal 43*n*. If the two signals to gate 120 are not the same the exclusive OR-gate 120 provides a positive signal to a lead of the NAND-gate 95. The input signals from terminal 44*c*, 44*d* and 44*e* are applied to NAND-gate 116 and gate 116 supplies a signal to the lower lead of the exclusive OR-gate 121. This signal is compared with the voltage from the output terminal 43*f* of FIGS. 3*a* and 3*b* and if the two signals are not the same the exclusive OR-gate 121 provides a positive signal to gate 95. In a similar manner the output signal of NAND-gate 117 is applied to one lead of exclusive OR-gate 122 and a signal from the output terminal 43*f* is applied to the other lead of exclusive OR-gate 122. Gates 121 and 122 compare input signals from gates 116 and 117 with signals from terminals 43*f* and 43*j* respectively. When all four of the inputs to NAND-gate 95 are positive NAND-gate 95 provides a low value of voltage to gate 98 to indicate that all of the gates in the reference integrated circuit compare with the gates in the integrated circuit being tested. The other leads to NAND-gate 98 which are not selected to compare integrated circuit chips provide positive voltages to gate 98. Any low value of voltage causes gate 98 to provide a positive voltage to the latch 103 so that the latch is not set and the compare LED 108 is not lighted. When the output of any of the gates 115–117 does not compare with the signal voltages at terminals 21*n*, 21*f* and 21*j* the NAND-gate 95 provides a positive voltage to the NAND-gate 98 thereby causing gate 98 to provide a low value of voltage to the latch 103 which sets the latch causing the voltage to resistor 107 to be low and causing the LED 108 to be lighted. The LED 108 warns that the circuit under test does not compare with the standard integrated circuit shown in FIG. 4.

While the principles of the invention have now been made clear in an illustrative embodiment, there will be many obvious modifications of the structure, proportions, materials and components without departing from those principles. The appended claims are intended to cover any such modifications.

I claim:

1. Apparatus for testing printed wiring boards having integrated circuit chips mounted thereon, each of said chips having a plurality of connector pins, said apparatus comprising:

a plurality of voltage comparators each having first and second input leads, a strobe lead and an output lead, said comparators being divided into first and second groups;

a multiconductor probe having a plurality of clips, each of said clips being connected to a corresponding one of said connector pins;

means for connecting each of said clips to said first input lead of a corresponding one of said voltage comparators in said first group and to said second input lead of a corresponding one of said voltage comparators in said second group;

a voltage source having first, second and third voltage output leads and first, second, third and fourth control leads, said first output lead of said source being connected to said second input lead of each of said comparators in said first group, said second output lead of said source being connected to said first input lead of each of said comparators in said second group;

a sequencer having first, second, third and fourth output leads, each of said output leads of said sequencer being coupled to a corresponding one of said control leads of said source, said first output lead of said sequencer being coupled to said strobe lead of each of said comparators in said second group; and a plurality of indicating devices, each of said devices being coupled to said output leads of a corresponding one of said comparators in said first group and to a corresponding one of said comparators in said second group.

2. Apparatus for testing printed wiring boards as defined in claim 1 including:

a plurality of bistable latches each having an input lead and an output lead, said input lead of each of said latches being connected to said output lead of a corresponding one of said comparators in said first group and to said output lead of a corresponding one of said comparators in said second group, said output lead of each of said latches being coupled to a corresponding one of said indicating devices.

3. Apparatus for testing printed wiring boards having integrated circuit chips mounted thereon, each of said chips having a plurality of connector pins, said apparatus comprising:

a plurality of voltage comparators each having first and second input leads, a strobe lead and an output lead, said comparator being divided into first and second groups;

a multiconductor probe having a plurality of clips, each of said clips being connected to a corresponding one of said connector pins;

means for connecting each of said clips to said first input lead of a corresponding one of said voltage comparators in said first group and to said second input lead of a corresponding one of said voltage comparators in said second group;

a voltage source having first, second and third voltage output leads and first, second, third and fourth control leads, said first output lead of said second being connected to said second input lead of each of said comparators in said first group, said second output lead of said source being connected to said first input lead of each of said comparators in said second group;

a sequencer and first, second, third and fourth output leads, each of said output leads of said sequencer being coupled to a corresponding one of said control leads of said source, said first output lead of said sequencer being coupled to said strobe lead of each of said comparators in said second group;

a plurality of timing circuits each having an input lead, an output lead and a control lead, said input lead of each of said timing circuits being coupled to said output lead of a corresponding one of said comparators in said first group and to said output lead of a corresponding one of said comparators in said second group, said control lead of each of said timing circuits being coupled to said third output lead of said source;

a plurality of bistable latches each having an input lead and an output lead, said input lead of each of said latches being connected to said output lead of a corresponding one of said timing circuits; and a plurality of indicating devices, each of said devices being coupled to said output lead of a corresponding one of said latches.

4. Apparatus for testing printed wiring boards as defined in claim 3 including:

a standard circuit chip having a plurality of input leads and a plurality of output leads, each of said input leads of said standard chip being connected to said output lead of a corresponding one of said voltage comparators in said first group;

a plurality of exclusive OR-gates each having first and second input leads and an output lead, said first input lead of each of said OR-gates being connected to a corresponding one of said output leads of said standard chip, said second iinput lead of each of said OR-gates being coupled to said output lead of a corresponding one of said voltage comparators in said first group; and a logic gate having an output lead and a plurality of input leads, each of said input leads of said logic gate being connected to said output lead of a corresponding one of said OR-gates.

5. Apparatus for testing printed wiring boards as defined in claim 3 including:

a plurality of standard circuit chips each having a plurality of input leads and a plurality of output leads, each of said input leads being connected to said output lead of a corresponding one of said voltage comparators in said first group;

a plurality of exclusive OR-gates each having first and second input leads and an output lead, said OR-gates being divided into groups with each group corresponding to one of said standard chips, said first input lead of each of said OR-gates in a group being connected to a corresponding one of said output leads of said standard chip in said corresponding group, said second input lead of each of said oR-gates being coupled to a said output lead of a corresponding one of said voltage comparators in said first group;

a plurality of logic gates each having an output lead and a plurality of input leads, said input leads of each of said logic gates being connected to a corresponding one of said output leads of said OR-gates in a corresponding one of said groups; and gating means having an output lead and a plurality of input leads, each of said input leads of said gating means being connected to said output lead of a corresponding one of said logic gates.

6. Apparatus for testing printed wiring boards as defined in claim 3 including:

a plurality of standard circuit chips each having a plurality of input leads and a plurality of output leads, each of said input leads being connected to said output lead of a corresponding one of said voltage comparators in said first group;

a plurality of exclusive OR-gates each having first and second input leads and an output lead, said OR-gates being divided into groups with each group corresponding to one of said standard chips, said first input lead of each of said OR-gates in a group being connected to a corresponding one of said output leads of said standard chip in said corresponding group, said second input lead of each of said OR-gates being coupled to a said output lead of a corresponding one of said voltage comparators in said first group;

a plurality of logic gates such having and output lead and a plurality of input leads, said input leads of each of said logic gates being connected to a corresponding one of said output leads of said OR-gates in a corresponding one of said groups;

gating means having an output lead and a plurality of input leads, each of said input leads of said gating means being connected to said output lead of a corresponding one of said logic gates;

a timing means having an input lead and an output lead, said input lead of said timing means being connected to said output lead of said gating means;

a latching means having an input lead and an output lead, said input lead of said latching means being connected to said output lead of said timing means; and an alarm device, said device being coupled to said output lead of said latching means.

7. Apparatus for testing printed wiring boards having integrated circuit chips mounted thereon, each of said chips having a plurality of connector pins, said apparatus comprising:

a plurality of voltage comparators each having first and second input leads, a strobe lead and an output lead, said comparators being divided into first and second groups;

a multiconductor probe having a plurality of clips, each of said clips being connected to a corresponding one of said connector pins;

means for connecting each of said clips to said first input lead of a corresponding one of said voltage comparators in said first group and to said second input lead of a corresponding one of said voltage comparators in said second group;

a voltage source having first, second and third voltage output leads and first, second, third and fourth control leads, said first output lead of said source being connected to said second input lead of each of said comparators in said first group, said second output lead of said source being connected to said first input lead of each of said comparators in said second group;

an oscillator having an output lead;

first and second flip-flops each having first, second and third input leads and first and second output leads, said second input lead of said first flip-flop being coupled to said output lead of said oscillator, said first output lead of said first flip-flop being connected to said second control lead of said source, said second output lead of said first flip-flop being connected to said second input lead of said second flipflop and to said first and said third input leads of said first flip-flop, said second output lead of said first flip-flop being connected to said fourth control lead of said source, said first output lead of said second flip-flop being connected to said first control lead of said source, said second output lead of said second flip-flop being connected to said third control lead of said source and to said first and said third input leads of said second flip-flop; and a plurality of indicating devices, each of said devices being coupled to said output leads of a corresponding one of said comparators in said first group and to a corresponding one of said comparators in said second group.

8. Apparatus for testing printed wiring boards as defined in claim 7 including:

a plurality of bistable latches each having an input lead and an output lead, said input lead of each of said latches being connected to said output lead of a corresponding one of said comparators in said first group and to said output lead of a corresponding one of said comparators in said second group, said output lead of each of said latches being coupled to a corresponding one of said indicating devices.

9. Apparatus for testing printed wiring boards having integrated circuit chips mounted thereon, each of said chips having a plurality of connector pins, said apparatus comprising:

a plurality of voltage comparators each having first and second input leads, a strobe lead and an output lead, said comparator being divided into first and second groups;

a multiconductor probe having a plurality of clips, each of said clips being connected to a corresponding one of said connector pins;

means for connecting each of said clips to said first input lead of a corresponding one of said voltage comparators in said first group and to said second input lead of a corresponding one of said voltage comparators in said second group;

a voltage source having first, second and third voltage output leads and first, second, third and fourth control leads, said first output lead of said source being connected to said second input lead of each of said comparators in said first group, said second output lead of said source being connected to said first input lead of said comparators in said second group;

an oscillator having an output lead;

first and second flip-flops each having first, second and third input leads and first and second output leads, said second input lead of said first flip-flop being coupled to said output lead of said oscillator, said first output lead of said first flip-flop being connected to said second control lead of said source, said second output lead of said first flip-flop being connected to said second input lead of said second flip-flop and to said first and said third input leads of said first flip-flop, said second output lead of said first flip-flop being connected to said fourth control lead of said source, said first output lead of said second flip-flop being connected to said first control lead of said source, said second output lead of said second flip-flop being connected to said third control lead of said source and to said first and said third input leads of said second flip-flop; and a plurality of timing circuits each having an input lead, an output lead and a control lead, said input lead of each of said timing circuits being coupled to said output lead of a corresponding one of said comparators in said first group and to said output lead of a corresponding one of said comparators in said second group, said control lead of each of said timing circuits being coupled to said third output lead of said source;

a plurality of bistable latches each having an input lead and an output lead, said input lead of each of said latches being connected to said output lead of a corresponding one of said timing circuits; and a plurality of indicating devices, each of said devices being coupled to said output lead of a corresponding one of said latches.

10. Apparatus for testing printed wiring boards as defined in claim 9 including:

a standard circuit chip having a plurality of input leads and a plurality of output leads, each of said input leads of said standard chip being connected to said output lead of a corresponding one of said voltage comparators in said first group;

a plurality of exclusive OR-gates each having first and second input leads and an output lead, said first input lead of each of said OR-gates being connected to a corresponding one of said output leads of said standard chip, said second input lead of each of said OR-gates being coupled to said output lead of a corresponding one of said voltage comparators in said first group; and a logic gate having an output lead and a plurality of input leads, each of said input leads of said logic gate being connected to said output lead of a corresponding one of said OR-gates.

11. Apparatus for testing printed wiring boards as defined in claim 9 including:

a plurality of standard circuit chips each having a plurality of input leads and a plurality of output leads, each of said input leads being connected to said output lead of a corresponding one of said voltage comparators in said first group;

a plurality of exclusive OR-gates each having first and second input leads and an output lead, said OR-gates being divided into groups with each group corresponding to one of said standard chips, said first input lead of each of said OR-gates in a group being connected to a corresponding one of said output leads of said standard chip in said corresponding group, said second input lead of each of said OR-gates being coupled to a said output lead of a corresponding one of said voltage comparators in said first group;

a plurality of logic gates each having an output lead and a plurality of input leads, said input leads of each of said logic gates being connected to a corresponding one of said output leads of said OR-gates in a corresponding one of said groups; and gating means having an output lead and a plurality of input leads, each of said input leads of said gating means being connected to said output lead of a corresponding one of said logic gates.

* * * * *